United States Patent [19]
Ouellet

[11] Patent Number: 5,320,983
[45] Date of Patent: Jun. 14, 1994

[54] SPIN-ON GLASS PROCESSING TECHNIQUE FOR THE FABRICATION OF SEMICONDUCTOR DEVICES

[75] Inventor: Luc Ouellet, Granby, Canada

[73] Assignee: Mitel Corporation, Kanata, Canada

[21] Appl. No.: 930,615

[22] PCT Filed: Feb. 6, 1991

[86] PCT No.: PCT/CA91/00041
§ 371 Date: Sep. 30, 1992
§ 102(e) Date: Sep. 30, 1992

[87] PCT Pub. No.: WO91/12630
PCT Pub. Date: Aug. 22, 1991

[30] Foreign Application Priority Data

Feb. 7, 1990 [CA] Canada .................. 2009518

[51] Int. Cl.⁵ ......................... H01L 21/465
[52] U.S. Cl. .................... 437/231; 437/228
[58] Field of Search .................. 437/231, 228

[56] References Cited

U.S. PATENT DOCUMENTS

| | | |
|---|---|---|
| 4,185,294 | 1/1980 | Sumimoto et al. . |
| 4,826,709 | 5/1989 | Ryan et al. . |
| 5,003,062 | 3/1991 | Yen .................... 437/231 |

FOREIGN PATENT DOCUMENTS

| | | |
|---|---|---|
| 2038109 | 4/1971 | Fed. Rep. of Germany . |
| 2146954 | 3/1972 | Fed. Rep. of Germany . |
| 7102579 | 9/1972 | France . |

OTHER PUBLICATIONS

G. Smolinsky, et al. "Material Properties of Spin-on Sox for Fully Recessed NMOS Field Isolation" *J. Electrochem. Soc.* vol. 137(1) Jan. 1990 pp. 229-233.

K. Osinski, et al. "A 1 µm CMOS Process for Logic Applications" *Phillips J. Res.* 44 (2,3) 1989 pp. 257-293.

M. Kuisl "Silicon Oxide Films Prepared by Spin-On Solutions" *Thin Solid Films* 157(1) Feb. 15, 1988 pp. 129-134.

Yen, et al. "Process Integration with Spin-on Glass . . . " 5th IEEE VLSI Conference, Jun. 13-14, 1988 pp. 85-94.

Nishida et al, "Multilevel Interconnection for ½µ VLSI's" 5th International IEEE VLSI Conf., pp. 19-25, 1988.

Forester et al., "SOG Planarization . . . " 5th International IEEE VLSI Conf. Jun. 13-14, 1988, pp. 72-79.

*Primary Examiner*—Olik Chaudhuri
*Assistant Examiner*—C. Everhart
*Attorney, Agent, or Firm*—Marks & Clerk

[57] ABSTRACT

A method of applying a spin-on glass layer to a substrate is disclosed characterized in that the spin-on glass is applied as a plurality of contiguous thin layers that together form a composite layer. Each thin layer is cured prior to the application of the next layer at a temperature of at least about 300° C., preferably 350° C., for a time sufficient to permit catalyst connection and substantially eliminate volatile residual solvents contained therein. In this way cracking in organic SOGs can be substantially eliminated, and beneficial results can also be achieved with quasi-organic SOGs.

6 Claims, 4 Drawing Sheets

SPLIT #1: SINGLE COAT OF
OCD-2P-80327-SG

SPLIT #2: THREE COATS OF
OCD-2P-37313-SG

SPIN-ON GLASS PROCESSING TECHNIQUE FOR THE FABRICATION OF SEMICONDUCTOR DEVICES

This invention relates to spin-on glass, and more particularly to a method of applying spin-on glass, especially inorganic or quasi-inorganic spin-on glass, to a semiconductor device without causing cracking or damage to the device.

Spin-on glasses (SOGs) are proprietary liquid solutions containing siloxane or silicate based monomers dissolved in various kinds of solvents or alcohols. During coating and curing, monomers are polymerized by condensation and release water, alcohol and other solvents.

The cured material is a thin solid film having mechanical, chemical and electrical properties that depend on the starting solution, and the coating and curing process.

A primary use of SOGs is in the planarization of dielectrics in the fabrication of semi-conductor devices. As will be explained in more detail below, during the fabrication process trenches are formed in the dielectric layer. Especially at high packing densities it becomes important to fill in these trenches to provide an even surface for further processsing. This process is known as "planarization."

Among many of the dielectric planarization techniques, SOG planarization is a particularly attractive method. It is relatively simple, economical and is capable of high throughput. SOG planarization can be used over polysilicon, refractory metals, polycides, silicides, aluminum and aluminum alloys, copper, and gold, where the main goal is to-smooth or eliminate steps in the surface and enhance step coverage by the dielectrics and interconnects.

SOG planarization can take three forms:
1) Complete etchback.
2) Partial etchback.
3) Non etchback.

Major manufacturing restrictions of the complete/partial etchback techniques impose the nonetchback approach as the preferred one in a production environment.

In this approach, SOG becomes a permanent part of the dielectric. Film properties are then of prime importance. Since SOG is generally a more porous material, when compared to LPCVD, APCVD, LACVD, PhACVD or PECVD oxides, it is more prone to water absorption. This water absorption reduces the bulk resistivity of the SOG and increases the power consumption of the semiconductor device due to current leakage between adjacent tracks of the same level of interconnect. For this reason, among others, SOG does not contact directly these tracks and is sandwiched between two denser LPCVD, APCVD, LACVD, PhACVD or PECVD dielectric films.

Interconnections are required between the upper and lower tracks, requiring the use of contacts or vias, and the SOG is then in direct contact with the interconnects at those locations. If too much water is present in the SOG, problems such as via poisoning can occur.

There are more than one hundred different SOG solutions on the market. These are classified in two major families:
· Quasi-inorganic SOGs
- Siloxanes (methyl-, ethyl-, phenyl-, butyl-, doped or undoped)
· Purely-inorganic SOGs.
- Silicates (doped or undoped)

Purely inorganic silicate SOGs are prone to severe cracking. The quasi-inorganic siloxane SOGs have a more flexible structure due to the presence of some organic radicals which prevent complete cross-linking of the $SiO_xC_yH_z$ matrix under condensation. The flexible structure reduces the tendency of an organic SOG to crack, but unfortunately the presence of the hydrogen atoms in the quasi-inorganic SOGs impairs the dielectric properties and essentially rules them out for use in sensitive CMOS devices.

Furthermore, the organic radicals are not stable at high temperatures and are not compatible with oxygen plasma photoresist strippers, which tend to transform the quasi-inorganic SOG to a purely inorganic SOG by burning the organic bonds and producing volatile compounds like $H_2O$, $CO_xH_y$, and silanol Si—OH. While inorganic SOGs are preferred, which are not degraded by the photoresist strippers, the cracking problem has imposed severe restrictions on layer thickness and thus the degree of planarization that can be achieved.

Planarization technology becomes increasingly important when the scale of integrated circuits shrinks to micron and sub-micron region.

Various techniques have been proposed to reduce cracking in inorganic SOG layers, but in all cases the maximum thickness of the crack-free layer obtainable is severely limited. U.S. Pat. No. 4,801,560 to Motorola discloses that a thicker glass layer can be obtained by depositing the spin-on glass in multiple layers separated by chemical vapour deposition oxide. This patent suggests that up to 30,000 Angstroms of glass can be deposited between the layers as opposed to 4,000 Angstroms previously attainable. However, the patent relates exclusively to carbon-containing, or quasi-organic SOGs. The patent states that without the carbon, the spin on glass layer becomes highly stressed and easily cracked, and further states that without carbon it is not possible to form a multi-layer structure as the layers do not bond adequately together.

The article "Material Properties of spin-on silicon dioxide for fulling recessed NMOS field isolation" [J. Electrochem. Vol. 137, no. 1, Jan. 1990, pages 229–234], describes a planarization technique involving applying a plurality of boron-doped SOX layers for filling trenches in a silicon substrate. In this process, temperatures in the order of 900° C. are required to achieve densification. Such a process would be useless of devices with metallic interconnects, since the high temperatures would melt the low temperature material (Aluminum has a melting point of 660° C.). At lower temperatures densification does not occur and the multilayer device cannot be formed.

U.S. Pat. No. 4,185,294 describes the use of a single spin-on glass planarization layer. This patent states that at thicknesses above 1500Å (150 nm.), the "resulting silica film is liable to crack" and does not contemplate a solution to this problem.

U.S. Pat. No. 3,663,277 discloses the use of a stratified insulating layer that is formed over an interconnect pattern by adding silicon dioxide liquid dispersion dropwise at ten second intervals. The insulating layer is not provided for the purpose of planarization, and the problem of crack formation is not addressed at all. Since the individual layers are not cured between applications (Clearly no curing will occur in ten seconds) but only the bulk material, the stratifed insulating layer is in effect equivalent to a bulk-applied layer. The same crack-formation problems arise.

An object of this invention is to permit the formation of thick spin-on glass layers, particularly inorganic spin-on glass layers, with reduced cracking.

According to the invention there is provided a method of applying a planarization layer of spin-on glass to a substrate with a metallic interconnect layer formed thereon. In accordance with the invention the planarization layer is formed from a plurality of sequentially applied component layers, the spin-on glass is inorganic or quasi-inorganic phosphorus-doped spin-on glass, and each component layer is cured in-line at a temperature of 300°-425° C. prior to application of the next layer for a time sufficient to connect organometallic catalysts and reduce residual carbon content to less than 1% without destroying the interconnect layer.

The invention is particularly applicable to inorganic spin-on glasses, which are preferred in semiconductor applications and for which the cracking problem is most severe. Surprisingly, the invention allows composite crack-free inorganic layers of 1,000 nm. or more to be formed. This is as the result of the catalytic connection and complete elimination of residual volatile solvents prior to the application of an overlying layer, which surprisingly occurs if the spin-on glass layer is heated to a temperature of at least 300° C., and preferably at least 350° C.

While the invention can be most usefully applied to inorganic spin-on glasses, it can also be applied beneficially to quasi-inorganic spin-on glasses, where improvement in the adhesion between the layers will occur.

Although spin-on glass can be applied for many purposes, the primary use of the invention is in the planarization of dielectric layers in semi-conductor devices, including CMOS devices Another aspect of the invention provides a device having a spin-on glass layer, wherein the spin-on glass is inorganic or quasi-inorganic and said spin-on glass layer comprises a composite layer of thickness t consisting of n contiguous thin layers, each having a thickness of approximately t/n.

BRIEF DESCRIPTION OF THE DRAWINGS

The invention will now be described in more detail, by way of example only, with reference to the accompanying drawings, in which:

Referring to FIGS. 1a to 1h, in a conventional planarization process a first layer of interconnect material, preferably aluminum, 1 (FIG. 1a) is deposited on a substrate 2 and etched away to expose tracks 1a, 1b (FIG. 1b). A layer of dielectric 3 (which can be LPCVD, APCVD, LACVD, PhACVD, PECVD, for example) is applied over the tracks 1a, 1b (FIG. 1c) and planarized with a spin-on glass layer 4 (FIG. 1d). This planarization with a spin-on glass layer is typically done with a dedicated SOG processor as follows:

(i) The wafer is transported from a sending cassette to a coating chamber.

(ii) a few ml of a SOG solution is dispensed at the centre of the wafer.

(iii) The wafer is spun at a given RPM to spread the solution uniformly and permit volatile compounds evaporation and film solidification.

(iv) The wafer is sequentially transport to in-line hot plates for in-line cures at relatively low temperature, typically lower than 250° C.

(v) The wafer is stored in a receiving cassette.

(vi) When all the wafers have been received in the receiving cassette, they are sent together for high temperature treatment, typically higher than 425° to 450° C.

Figure 1A:
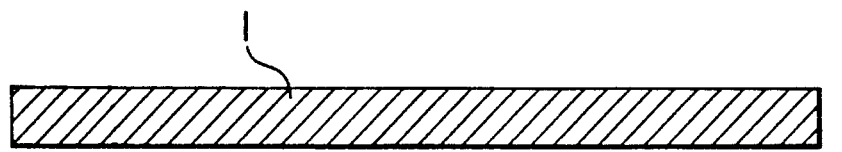
FIGS. 1a to 1h show the various stages in the fabrication of a semi-conductor device with a conventional planarization layer.
Figure 1B:
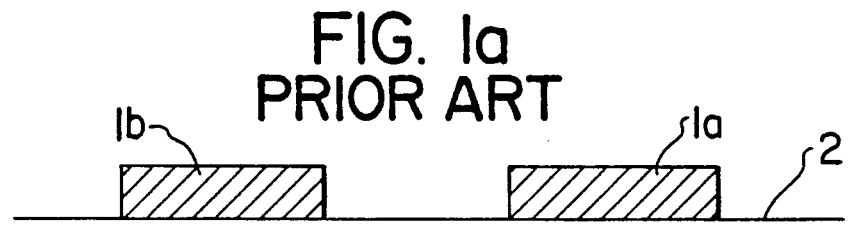
Figure 1C:
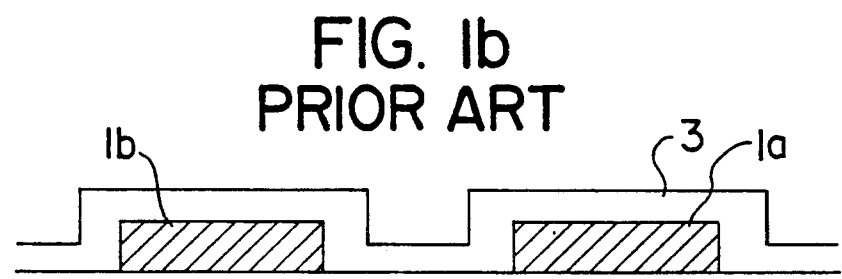
Figure 1D:
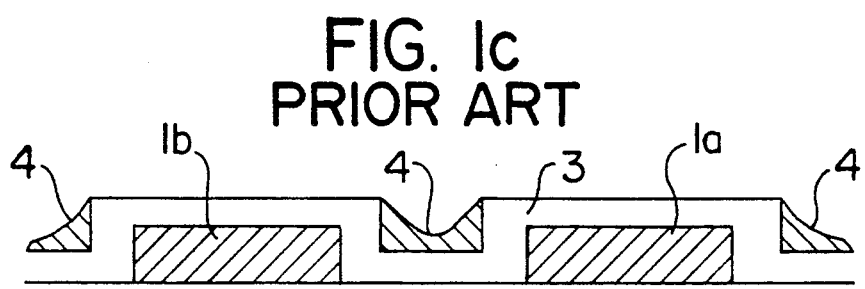
Figure 1E:
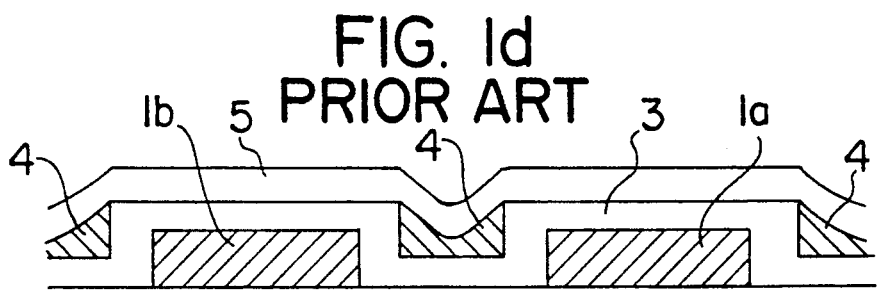
Figure 1F:
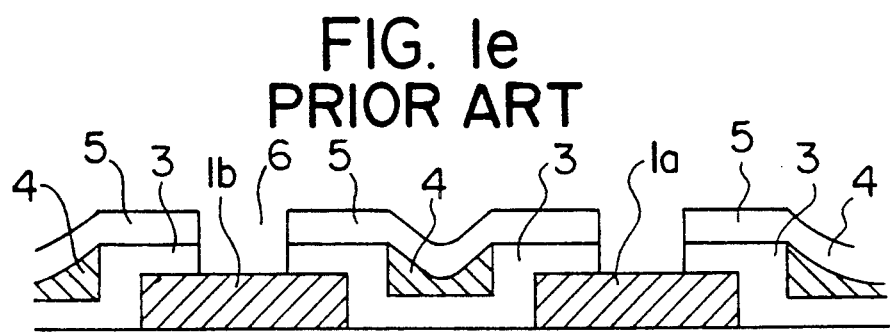
Figure 1G:
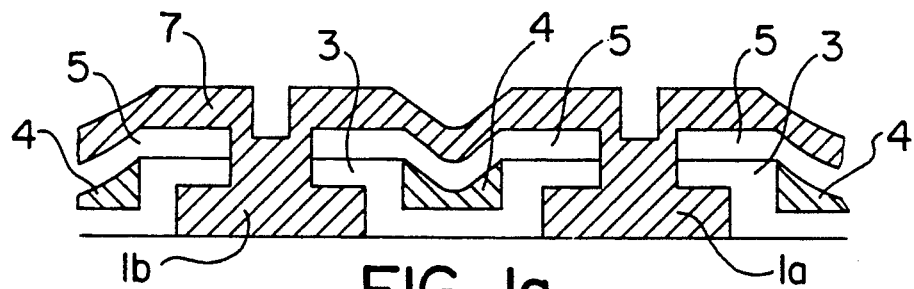

A second dilectric layer 5 is applied (FIG. 1e) and contact holes 6 (FIG. 1f) are formed in the dielectric layers 3, 5 to expose the tracks 1a, 1b (FIG. 1f). A second layer of interconnect material 7 is deposited on the resulting structure (FIG. 1g), and the intervening material of the second level of interconnect etched away to form the finished interconnect tracks 7a, 7b.

Figure 1H:
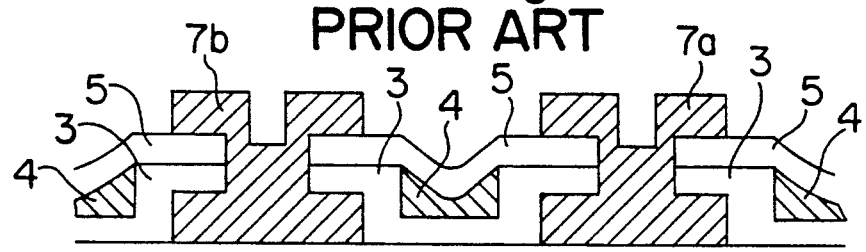

As will be seen in FIG. 1h, the planarization is not perfect due to the limitation on the possible thickness of the SOG layer 4. At wider line spacings, such as is shown in FIG. 1h, incomplete planarization can be tolerated.

Figure 2A:
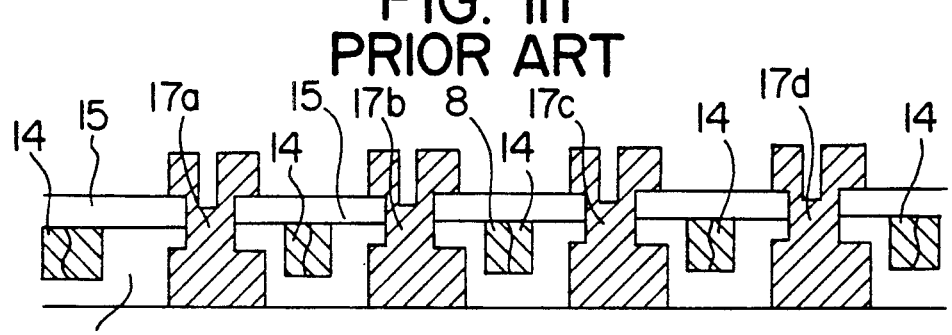
FIG. 2a shows a planarized device with reduced line spacings, showing crack formation in the SOG layer.

FIG. 2a shows a high density device, which employs narrower line spacings. Aluminum tracks 17a, 17b, 17c, 17d are separated by dielectric layers 13, 15 planarized with SOG layers 14. Unfortunately, the formation of cracks 8 in the deeper SOG layers 14, due to surface tension and capillary effects, has limited the application of this technique to such high density devices.

Since the second layer of dielectric is deposited directly over the cured SOG, good planarization requires a high viscosity SOG solution, and this implies the accumulation of a very thick SOG layer in the valleys. During the high temperature cure, film contraction occurs, film stress increases, and cracking results.

To prevent this cracking problem, a very flexible and high carbon content quasi-inorganic SOG has been tried, but this technique has proved unacceptable because of an important field inversion problem due to the effect of the hydrogen contained in the organic bonds of the quasi-inorganic SOGs on the characteristics of the CMOS semiconductor devices, and such SOGs cannot be used in CMOS devices. As a result there has been a tendency to avoid SOG planarization altogether in these devices despite its inherent advantages.

It has been found that, surprisingly, the cracking problem that occurs, especially within inorganic SOGs, can be eliminated by forming a multi-layer composite structure provided that each layer of the composite structure is heated to at least 300° C., and preferably at least 350° C. prior to the application of the next layer. The reasons for this are that after the application of each coat, the organometallic catalyst is connected, volatile by-products of that connection can evaporate and mutual bonding of the layers is enhanced by the absence of solvents, such as water and alcohols, which could be released during the final curing process. If a subsequent layer is applied with these substances absent in the underlying layer it is possible to form a coherent composite structure because internal volatile pressurization does not occur and the layers become well bonded together.

Figure 2B:
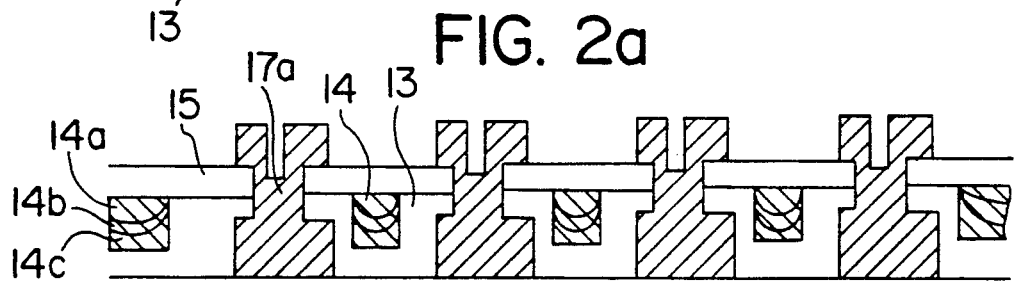
FIG. 2b shows a wafer similar to FIG. 2a with a composite SOG layer in accordance with the invention.

In FIG. 2b the composite SOG layer 14, which is 210 nm. thick, consists of three thin layers 14a, 14b, 14c, each 67 nm. thick. The SOG solution applied in the planarization step is a phosphorus doped SOG solution. This is a mixture of a silanol $si_x,O_y(OH)_z$, or an organosilanol polymer, $Si_w,O_x(OH)_y(OC_2H_5)_z$, a phosphorus organometallic polymer of $P_wO_x(OH)_y(OR)_z$, water, and a mixture of alcohols, R—OH. This solution is stable when contained in a sealed bottle.

After dispensing and spinning, the alcohols and water evaporate and this permits the formation of a very porous solid by silanol condensation which results in more water formation:

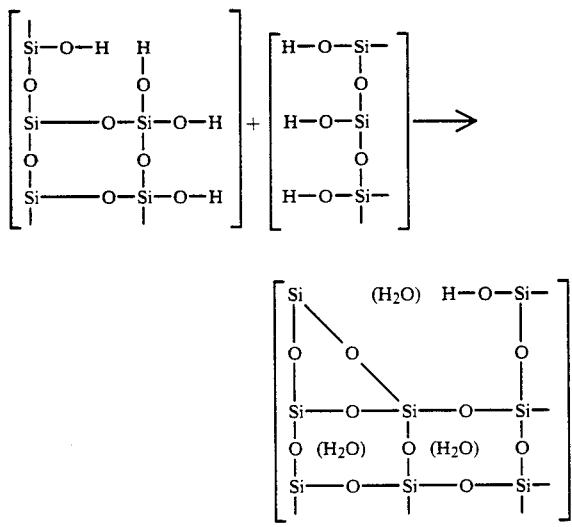

This porous solid then contains dissolved water, alcohols and the not yet-bonded phosphorus organometallic compound. The wafer coated with this porous solid is normally sequentially transported to in-line hot plates for the evaporation of the alcohols and water.

Chemical bonding between the phosphorus organometallic compound and the porous solid does not normally occur during this heat treatment with the in-line hot plates because typical in-line temperature is limited to about 250° C.

When exposed to higher temperature (>400° C.), the phosphorus organometallic molecule connects to the porous solid and causes a substantial volumetric shrink, densification, and the formation of water, $H_2O$, and alcohols, such as ethanol, $C_2H_5OH$. This process can be represented as follows:

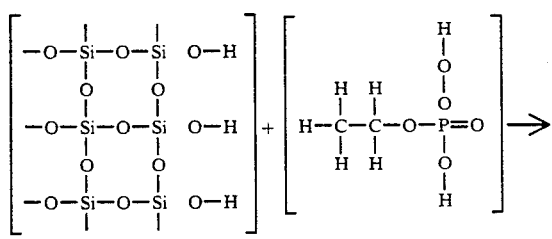

-continued

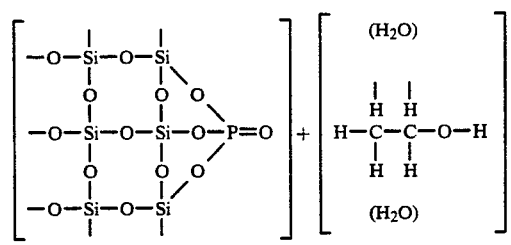

The liberation at this stage of a large and highly volatile molecule such as ethanol in this densifying porous solid is responsible for the generation of a high stress in the solid. Gas pressure increases in the closing pores due to the high temperature used and volatility of these by-products.

The pressurization of the layer is not homogeneous due to the fact that it is harder for the ethanol produced at the bottom to diffuse over the larger distance to reach the surface and escape. The stress is then larger at the bottom of the layer.

This ethanol diffusion from the bottom of the layer is particularly difficult because the surface of the film densifies faster than its interior; the thicker the film the more difficult the ethanol diffusion up to the surface and the more difficult the crack prevention becomes.

When the internal pressurization causes a local mechanical stress which exceeds the mechanical strength of the solid, cracks form and propagate.

During high temperature exposure, water and ethanol must diffuse through the solid layer up to the surface from which it will evaporate. Diffusion theory states that:

$$d = (Dt)^{\frac{1}{2}},$$

where d is the thickness of the layer and t is the curing time. The time required to reach the surface is therefore proportional to the square of the film thickness:

$$t = Dd^2$$

By using multiple thin layers, instead of a single thick layer, the elimination of dissolved water and alcohol is much easier, and cracking can be eliminated For example, if instead of using a single d=200 nm SOG layer, three layers having a thickness d' of 67 nm are used, and if a complete SOG cure is carried between each application, the time t' required to eliminate the dissolved water and alcohol, per coat, is:

$$t' = D(d')^2 = D(d/3)^2 = D(d)^2/9 = t/9;$$

if three coats are applied the total required time is 3t'=t/3. By using multiple thin coats, the SOG cure can be greatly improved. In fact, if the curing time per coat, t', is kept equal to the full curing time, t, a dryer and higher quality SOG film is obtained, larger cumulative thickness is possible, and tighter IC geometries are achievable. Three layers have been described, but the larger the number of coats, the better the final result and crack prevention.

EXAMPLE

A test structure was made as illustrated in FIG. 2b with various photolithographically patterned aluminum lines and spacings. Three 67 nm layers of TOK OCD-2P-37313-SG, 4.0 wt. % $P_2O_5$ SOG were applied, with each layer cured at 350° C. for a time sufficient to eliminate the dissolved water and alcohol. In this case $t' = 60$ seconds per coat, and the overall time $3t'$ was 180 seconds.

Figure 3A:
FIG. 3a shows a 200 nm. single SOG layer.
Figure 3B:
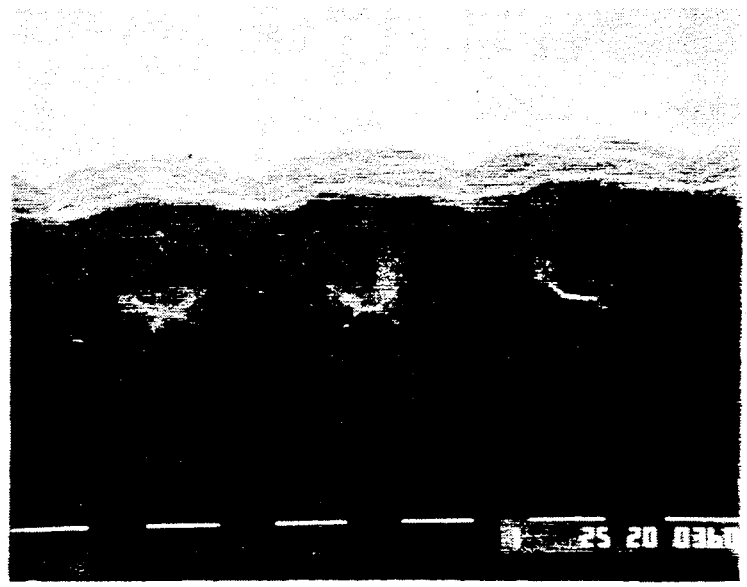
FIG. 3b shows a 210 nm. composite SOG layer consisting of three 67 nm. thin layers.

As shown in FIG. 3b, the resulting composite SOG layer was crack free.

COMPARISON EXAMPLE

A single 200 nm SOG layer was formed on an identical structure as shown in FIG. 2a. The SOG layer consisted of TOK OCD-2P-80327-SG, 4.0 wt. % $P_2O_5$ SOG. A single cure of 60 seconds was carried out after the layering in accordance with prior art practice. The wafer was then split so as to cleave the SOG, and cracks were observed as shown in FIG. 3a.

In order to determine the temperature needed to ensure organometallic catalyst connection, volatile by-product evaporation between each coat and then adequate bonding between the multiple SOG layers, a gravimetric-calorimetric Differential Thermal Analysis (DTA) experiment was carried out to identify the temperature at which connection of the organometallic material in the SOG to the porous self matrix occurred. The SOG used was OCD-2P-37313-SG.

Figure 4:
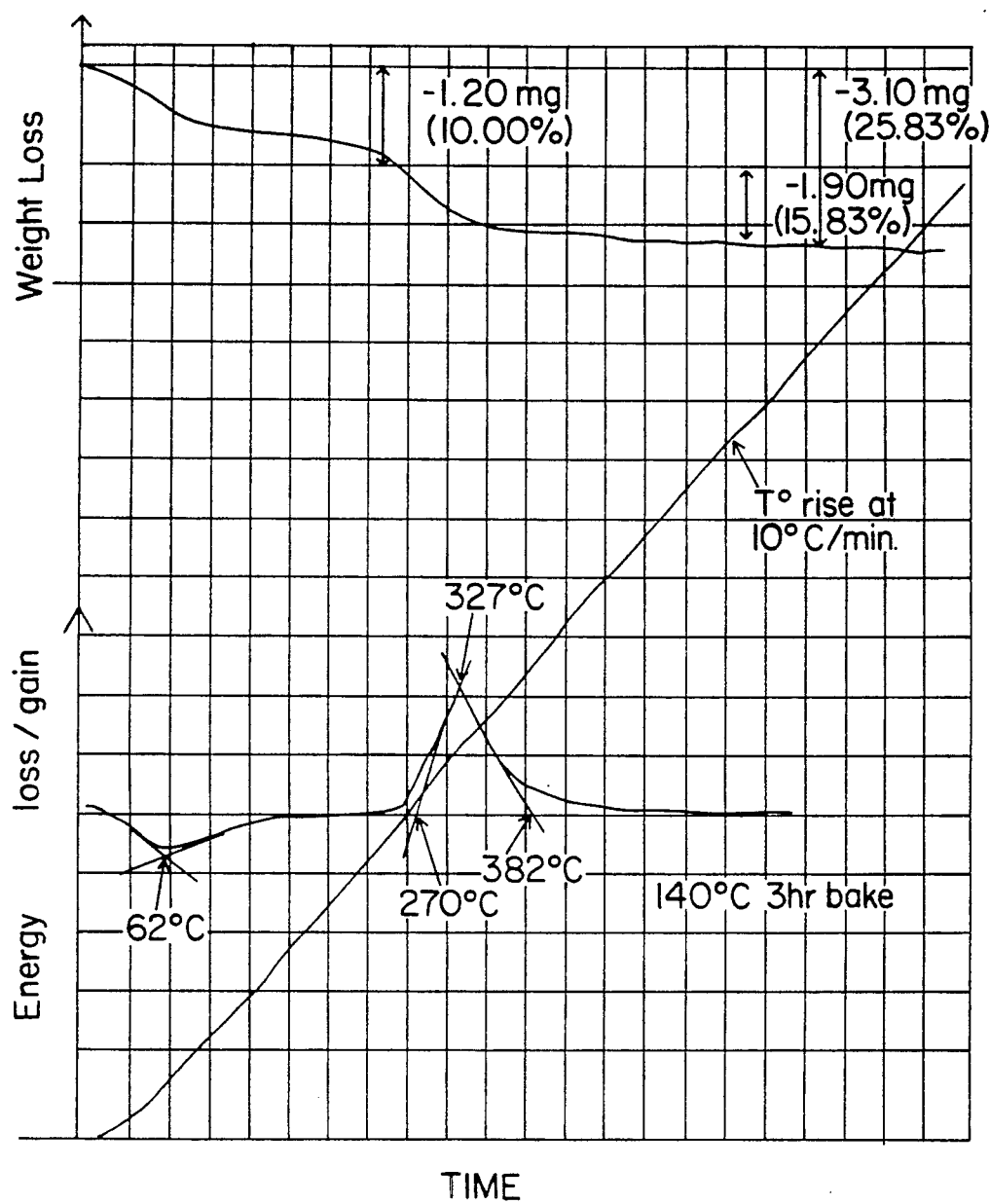
FIG. 4 is a chart of a differential thermal analysis experiment performed to identify the temperature required to connect the organometallic catalyst material, densify the network, and evaporate the volatile by-products such as ethanol.

FIG. 4 is a chart showing the results.

For such DTA analysis some SOG solution was dried at a temperature of 140° C. for about three hours, cooled in room air for many hours, and installed in the DTA apparatus. Its temperature was raised from 25° C. to 1000° C. at a fixed rate of 10° C./min. The upper curve represents the weight loss of a SOG film and the lower curve shows the heat loss/gain of the SOG as its temperature is increased.

The low temperature endothermic peak associated with a 10.00% weight loss shows that a quite large quantity of absorbed gas is released from the open pores at low temperature (62° C.); This is mainly moisture and ethanol. The high temperature (327° C.) peak associated with a 16.0% weight loss is the peak of interest. It corresponds to the connection of the phosphorus organometallic molecule to the porous network, to volumetric contraction and to ethanol connection by-product evaporation. This graph indicates that a temperature of about 350° C. is needed to connect the organometallic, densify the matrix, and evaporate the newly formed ethanol by-product.

Temperatures as low as 300° C. can be used, but 350° C. is preferred to ensure good connectivity densification and evaporation.

The confirmation of total ethanol elimination was done by means of nuclear analysis:

Elastic Recoil Detection (ERD) using high energy (30 MeV) $^{35}Cl$ ions, mylar absorber, and time of flight (TOF) analyzer can easily detect light elements such H and C in thin films. This technique was used to analyze and compare the SOG films obtained after in-line cure on the SOG processor and after high temperature cure in a controlled oven.

For the SOG used, the presence of the phosphorus organometallic molecule was detected by the carbon present in its ethoxy group. This carbon content (limit of detection less than 0.01 atomic %) was about 2.0 atomic %. If the molecule connects to the solid, its ethoxy group forms volatile ethanol and the carbon content is reduced. The lower the carbon content, the better the confirmation of the organometallic molecule connection (the better crack prevention).

A 67 nm film was coated and cured in-line with a hot plate at 350° C. to permit ethoxy group connection and volatile ethanol formation. Another coat of the same thickness was applied and cured the same way. Finally, a third identical coat was applied and cured. The three coat sandwich (200 nm) was then heated in a two-step high temperature oven in nitrogen at a temperature not exceeding 425° C. (noted as high T #1 and high T #2), and analysed. The measured atomic concentrations were as given below:

| PROCESS STEP | C | H | N | O | Si | P |
|---|---|---|---|---|---|---|
| after in-line cure at 350° C. | <0.01 | 10.48 | <0.01 | 61.88 | 26.80 | 00.83 |
| after high T° #1 | <0.01 | 10.38 | 00.04 | 61.54 | 27.30 | 00.73 |
| after high T° #2 | <0.01 | 10.38 | 00.04 | 61.71 | 26.82 | 00.64 |

It can be seen that the phosphorus is present after the in-line cure but no carbon is detected. The phosphorus organometallic molecule's ethoxy groups, -$C_2H_5$, became cross linked with the densifying solid's silanol groups, Si—OH, to permit the connection of the phosphorus and the generation of volatile ethanol, $C_2HOH$, which escaped completely from the solid.

The comparison of the carbon and hydrogen composition after "in-line" after high T°#1 and after T°#2 show that the volatiles that could cause film cracking were already removed after the in-line cure of the three coats on the SOG processor due to the in-line 350° C. hot plate. This result is extremely important.

Undesirable residual hydrogen is bound to silicon and phosphorus though oxygen to form —Si.OH and P.OH radicals.

Although the invention is especially applicable to inorganic SOGs, since it is inorganic SOGs that cause the most severe cracking problems and inorganic SOGs that are most desirable for planarization layers in CMOS devices, the invention can be beneficially applied to quasi-inorganic SOGs to reduce cracking and permit organic volatile by-products to be reduced.

The number of thin layers can be varied. As a general rule, the great the number of layers, the better the end results.

The SOG layers can be heated with in-line high temperature hot plates, or alternatively an in-line oven, an in-line plasma cure device, an in-line microwave device, or an in-line ozone device, or an in-line UV-ozone device, to permit connection of the catalyst and elimination of the organic by-products. The important point is that the volatile substances are eliminated between the application of each SOG layer.

I claim:

1. An in-line method of planarizing a substrate with a metallic interconnect layer formed thereon, comprising sequentially depositing a plurality of spin-on glass component layers on said substrate to form a composite planarization layer; said spin-on glass component layers comprising a mixture of a silanol polymer ($Si_xO_y(OHP_z)$) or an organosilanol ($Si_wO_x(OH)_y(OC_2H_5)_z$), phosphorus organometallic catalyst ($P_wO_x(OH)_y(OR)_z$), water, and a mixture of alcohols; each component spin-on glass layer being subjected to in-line heat treatment at a temperature of 300°–425° C. prior to application of the next component layer for a time, which is in the order of 60 seconds, that is just sufficient to connect the organometallic catalyst and reduce residual carbon atomic concentration after connection of the organometallic catalyst to less than 1% without destroying the underlying interconnect layer.

2. A method as claimed in claim 1, characterized in that each thin layer is cured at a temperature in the order of 350° C.

3. A method as claimed in claim 2, characterized in that each thin layer is cured for the full curing time that would be required to remove the volatile by-products from a single spin-on glass layer having a thickness equal to the composite thickness of said plurality of component layers.

4. A method as claimed in claim 1, characterized in that said spin-on glass is an inorganic spin-on glass.

5. A method as claimed in claim 1, characterized in that said spin-on glass is cured at a temperature of at least 300° C. with the aid of heating means selected from the group consisting of: in-line high temperature plates, an in-line oven, an in-line plasma cure device, an in-line microwave device, an in-line ozone device, and an-line UV-ozone device.

6. A method as claimed in claim 1, characterized in that the thickness of each component layer is in the order of 67 nm.

* * * * *